United States Patent
Sadjadi et al.

(10) Patent No.: US 7,273,815 B2
(45) Date of Patent: Sep. 25, 2007

(54) ETCH FEATURES WITH REDUCED LINE EDGE ROUGHNESS

(75) Inventors: S. M. Reza Sadjadi, Saratoga, CA (US); Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 54 days.

(21) Appl. No.: 11/208,098

(22) Filed: Aug. 18, 2005

(65) Prior Publication Data

US 2007/0042607 A1 Feb. 22, 2007

(51) Int. Cl.
*H01L 21/302* (2006.01)

(52) U.S. Cl. .................. 438/689; 438/689; 438/709; 438/710; 438/722; 438/778; 438/240; 438/357; 257/410; 257/406; 257/411

(58) Field of Classification Search ............... 438/689; 257/410

See application file for complete search history.

(56) References Cited

U.S. PATENT DOCUMENTS

| | | | |
|---|---|---|---|
| 4,151,034 | A | 4/1979 | Yamamoto et al. |
| 4,871,630 | A | 10/1989 | Giammarco et al. |
| 5,273,609 | A | 12/1993 | Moslehi |
| 5,296,410 | A | 3/1994 | Yang |
| 5,501,893 | A | 3/1996 | Laermer et al. |
| 5,895,740 | A | 4/1999 | Chien et al. |
| 6,187,685 | B1 | 2/2001 | Hopkins et al. |
| 6,261,962 | B1 | 7/2001 | Bhardwaj et al. |
| 6,368,974 | B1 | 4/2002 | Tsai et al. |
| 6,656,282 | B2 | 12/2003 | Kim et al. |
| 6,740,977 | B2 | 5/2004 | Ahn et al. |
| 6,750,150 | B2 | 6/2004 | Chung et al. |
| 6,780,708 | B1 | 8/2004 | Kinoshita et al. |
| 2005/0164479 | A1* | 7/2005 | Perng et al. ............... 438/591 |

OTHER PUBLICATIONS

E. Eisenbraun, Proceedings of IEEE (2001, pp. 207-209.*
U.S. Appl. No. 10/648,953, entitled "Reduction of Feature Critical Dimensions", by inventors Kang et al., filed Aug. 26, 2003.
U.S. Appl. No. 11/016,455, entitled "Reduction of Etch Mask Feature Critical Dimensions", by inventors Huang et al., filed Dec. 16, 2004.
U.S. Office Action mailed Jun. 28, 2004, from Appl. No. 10/648,953.
U.S. Office Action mailed Oct. 5, 2004, from Appl. No. 10/648,953.
U.S. Office Action mailed Mar. 21, 2005, from Appl. No. 10/648,953.
U.S. Office Action mailed Sep. 7, 2005, from Appl. No. 10/658,953.
U.S. Office Action mailed Feb. 23, 2006, from Appl. No. 10/648,953.
U.S. Office Action mailed Jul. 25, 2006, from Appl. No. 10/648,953.
U.S. Office Action mailed Jan. 5, 2007 from Appl. No. 11/016,455.
U.S. Office Action mailed Jan. 17, 2007, from Appl. No. 10/648,953.

* cited by examiner

*Primary Examiner*—Lan Vinh
*Assistant Examiner*—Maki Angadi
(74) *Attorney, Agent, or Firm*—Beyer Weaver LLP

(57) ABSTRACT

A method for forming a feature in a layer with reduced line edge roughening is provided. A photoresist layer is formed over the layer. The photoresist layer is patterned to form photoresist features with photoresist sidewalls. A sidewall layer with a thickness less than 100 nm is formed over the sidewalls of the photoresist features by performing for a plurality of cycles. Each cycle comprises depositing a layer on the photoresist layer wherein the deposited layer has a thickness between a monolayer to 20 nm. Features are etched into the layer through the photoresist features. The photoresist layer and sidewall layer are stripped.

18 Claims, 7 Drawing Sheets

ETCH FEATURES WITH REDUCED LINE EDGE ROUGHNESS

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

One problem in such processes is that microscopic photoresist structures with small widths are likely to change shape during processing. This deformation may be transferred into the film being etched, yielding etch structures, which deviate from the intended shape, dimension, or roughness. These etch-induced photoresist transformations may be classified in groups such as line edge roughening, surface roughening, and line wiggling. Line edge roughness (LER) refers to the edges of patterned lines becoming more irregular as the pattern is transferred from photoresist to the underlying film.

SUMMARY OF THE INVENTION

To achieve the foregoing and in accordance with the purpose of the present invention a method for forming a feature in a layer with reduced line edge roughening is provided. A photoresist layer is formed over the layer. The photoresist layer is patterned to form photoresist features with photoresist sidewalls. A sidewall layer with a thickness less than 100 nm is formed over the sidewalls of the photoresist features by performing for a plurality of cycles. Each cycle comprises depositing a layer on the photoresist layer wherein the deposited layer has a thickness between a monolayer to 20 nm. Features are etched into the layer through the photoresist features. The photoresist layer and sidewall layer are stripped.

In another manifestation of the invention a method for forming a feature in an etch layer with reduced line edge roughening is provided. A patterned photoresist layer is formed over the etch layer to form photoresist features with photoresist sidewalls. A sidewall layer with a thickness less than 100 nm is formed over the sidewalls of the photoresist features, comprising performing for a plurality of cycles. Each cycle comprises depositing a layer on the photoresist layer wherein the deposited layer has a thickness between a monolayer to 20 nm and etching back the deposited layer to remove parts of the deposited layer formed over bottoms of the photoresist features, while leaving a sidewall layer. Features are etched into the etch layer through the photoresist features. The photoresist layer and sidewall layer are stripped, where the depositing the layer on the photoresist layer, the etching back, the etching features, and stripping are done in situ in a single plasma chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Line edge roughening is believed to be caused by non-uniform deposition, ion sputtering by ions coming at a steep angle relative to the lines, lack of mobility of the photoresist or mask, stress mismatch between the photoresist, mask and etch by products (polymers), and photoresist or mask chemical modifications. Although line edge roughening manifests itself in different forms, the same factors can also cause twisting or wiggling of the photoresist or mask. Rather than just a roughening of the photoresist, wiggling or twisting refers to a change in the shape of the line as viewed from above, with a length scale similarly to the width of the line. Wiggling specifically refers to the modification of narrow line structures, which result from the roughening of the photoresist. Line edge roughening may be seen for dense contact or dense cell etch, where the faceting of the photoresist may lead to formation of very thin structures at the top of the photoresist. Despite different formulations of resist and masks used for different lithography technologies, wiggling has been observed for deep ultraviolet DUV photoresist, 193 nm photoresist, and even harder masks such as amorphous carbon.

The detailed mechanism, which causes wiggling, is not well-understood, but can be attributed to factors previously mentioned. However, it has been shown that excessive polymer deposition on top of the photoresist lines can induce wiggling. This is believed to be caused by stress in the deposited-film, which tends to pull the photoresist out of shape. The problem may be aggravated by the tendency of photoresist, especially 193 nm varieties, to soften during etch processing. This mechanism does not explain all instances of wiggling. In some cases, a process is clearly etching the photoresist, no depositing, yet the photoresist may wiggle. Wiggling may be related to modification of the photoresist composition during the etch, which is more severe for 193 nm photoresist.

Figure 1:
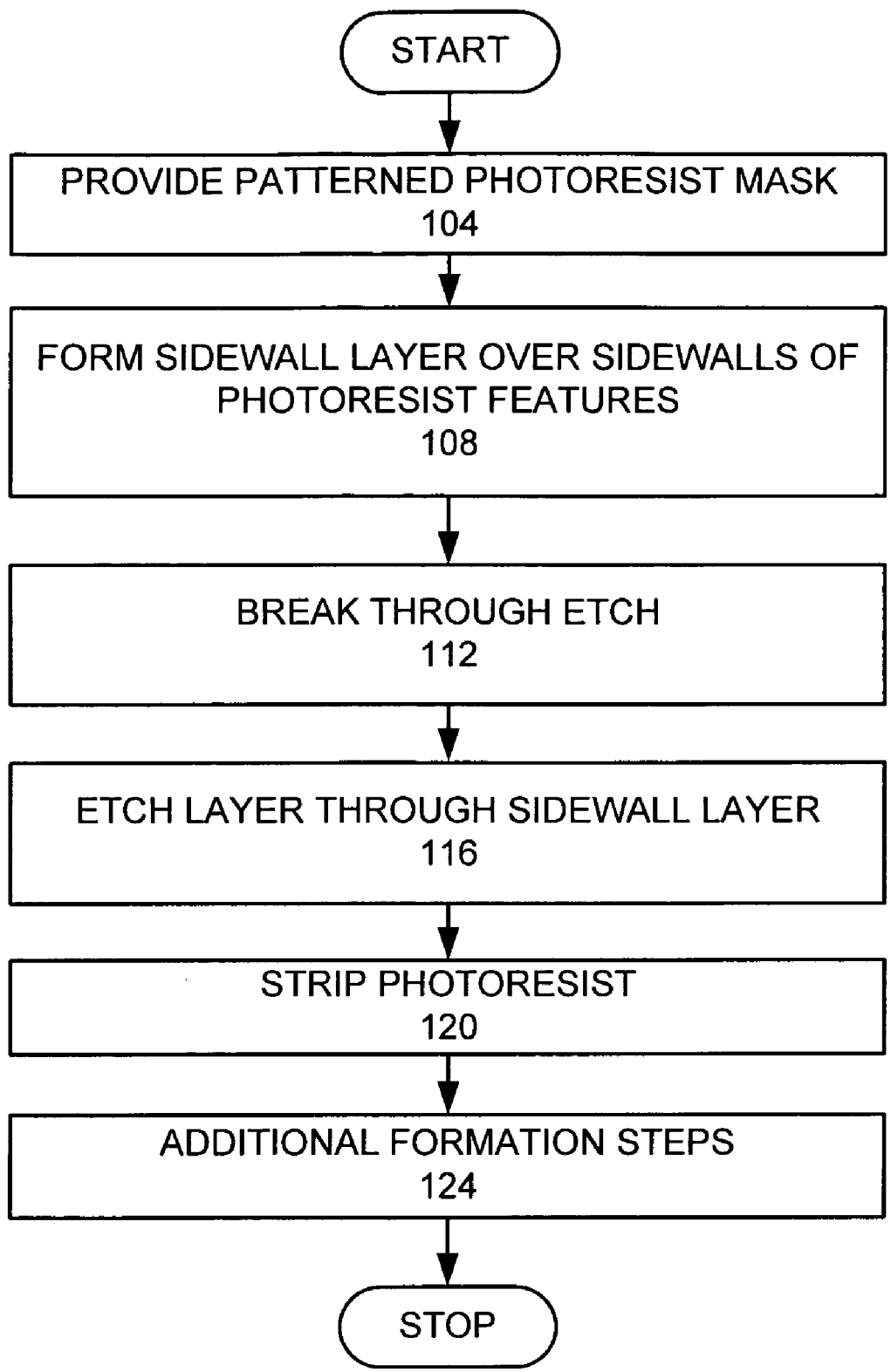
FIG. 1 is a high level flow chart of a process that may be used in an embodiment of the invention.
Figure 2A:
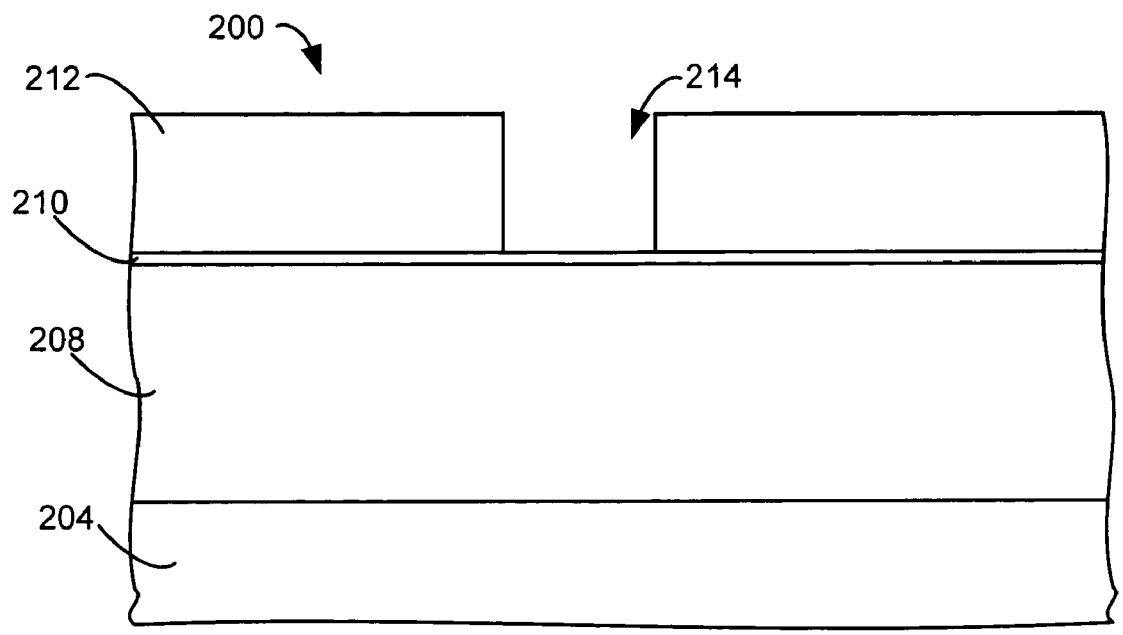
FIGS. 2A-D are schematic cross-sectional views of a stack processed according to an embodiment of the invention.

To facilitate understanding, FIG. 1 is a high level flow chart of a process that may be used in an embodiment of the invention. A patterned photoresist mask is provided (step 104). FIG. 2A is a schematic cross-sectional view of a layer to be etched 208 over a substrate 204, with a patterned photoresist mask 212 with a feature 214, over ARL 210, over the etch layer 208 forming a stack 200. The photoresist mask has a photoresist feature critical dimension (CD), which may be the widest part of the width 316 of the smallest possible feature. Presently, for 248 nm photoresist a typical CD for the photoresist may be 230-250 nm, using conventional processes. To provide the patterned photoresist mask, a photoresist layer may be first formed over the layer to be etched. Then the photoresist layer is patterned to form photoresist features with photoresist sidewalls.

Figure 2B:
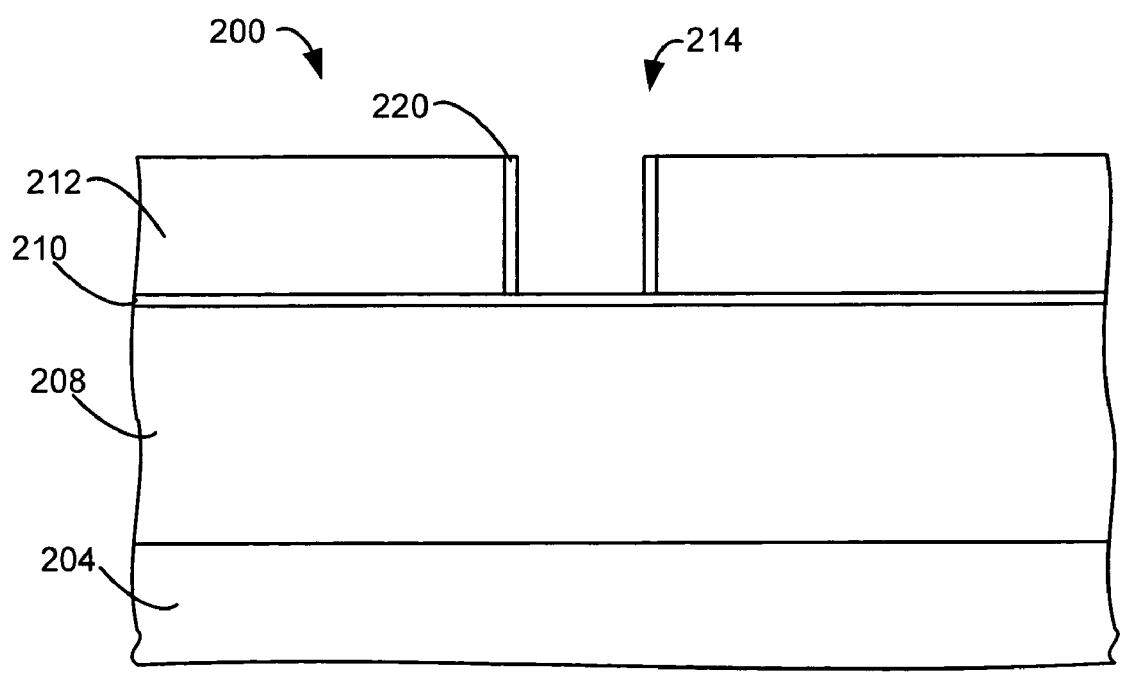

A sidewall layer is formed over the sidewalls of the photoresist features (step 108). FIG. 2B is a schematic cross-sectional view of the patterned photoresist mask 212 with a sidewall layer 220 formed over the sidewalls of the feature 214. The sidewall layer preferably forms substantially vertical and conformal sidewalls. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching mask.

A break through etch may be used to etch through any remaining deposited layer immediately above the etch layer any other intermediate layer above the etch layer (step 112).

Figure 2C:
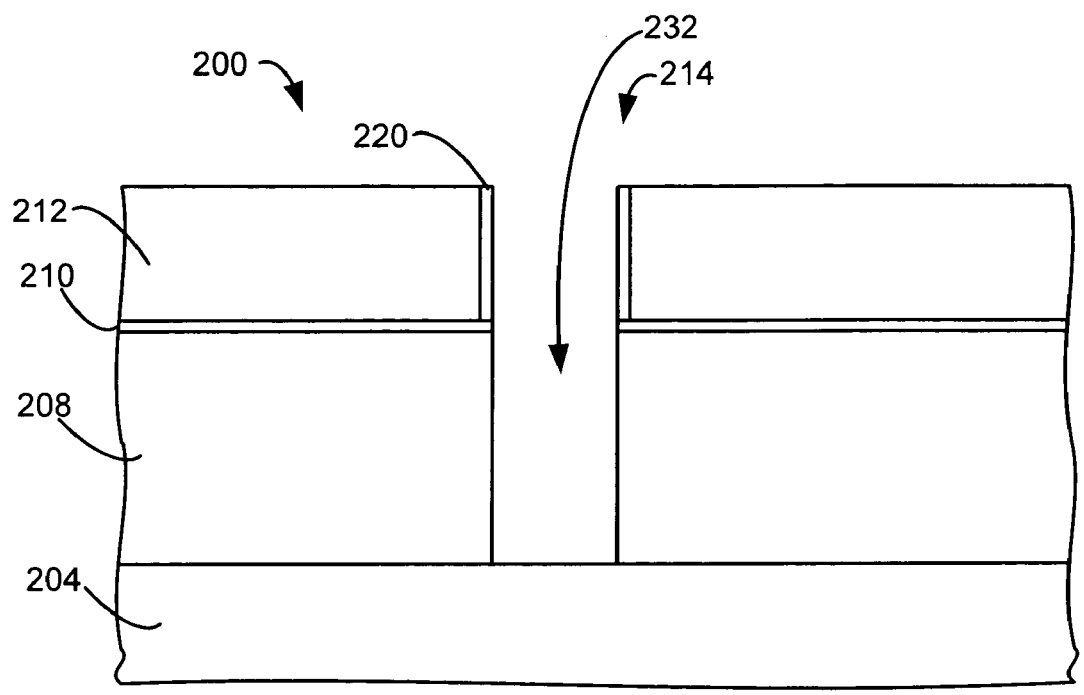

Features are then etched into the layer to be etched 208 through the formed sidewall layer 220 (step 116). FIG. 2C shows a feature 232 etched into the layer to be etched 208.

Figure 2D:
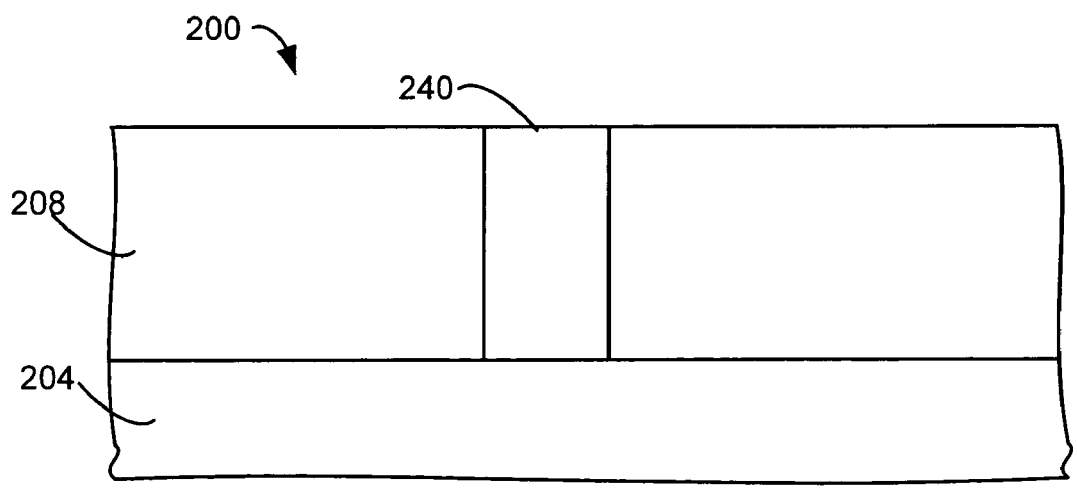

The photoresist and sidewall layer may then be stripped (step 120). This may be done as a single step or two separate steps with a separate deposited layer removal step and photoresist strip step. Ashing may be used for the stripping process. FIG. 2D shows the stack 200 after the deposited layer and photoresist mask have been removed. Additional formation steps may be performed (step 124). For example, a contact 240 may then be formed in the feature. To provide a dual damascene structure, a trench may be etched before the contact is formed. Additional processes may be performed after the contact is formed.

Figure 3:
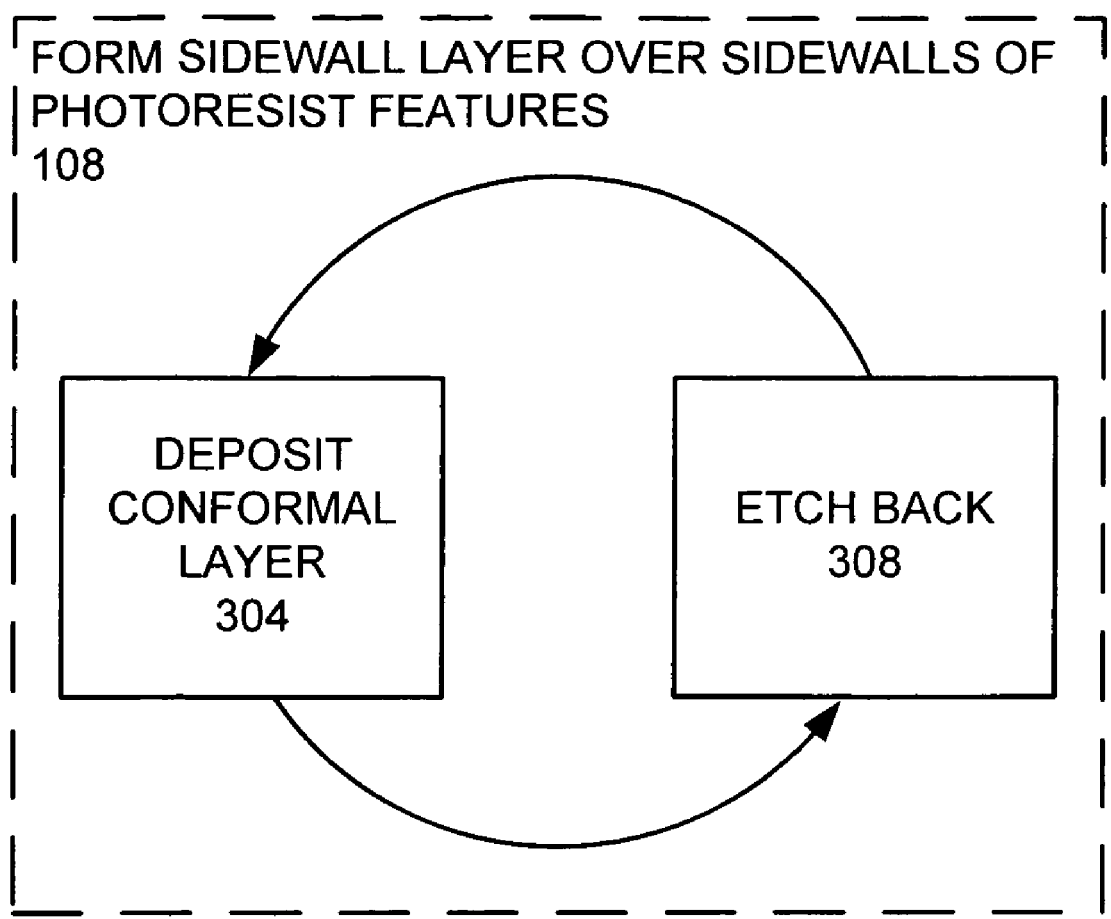
FIG. 3 is a more detailed flow chart of the step of depositing a layer over sidewalls of photoresist features to reduce CD.

FIG. 3 is a more detailed flow chart of an embodiment of the forming a sidewall layer over sidewalls of the photoresist features (step 108). This step is a cyclical step that is repeated at least twice. A conformal layer is deposited over the photoresist layer (step 304). The conformal layer is then etched back to remove any deposition at the bottom of the photoresist features to form the sidewall layers (step 308).

EXAMPLE

In one example, a substrate 204, with the layer to be etched 208, an ARC layer 210, and a patterned photoresist mask 212 is placed in an etch chamber.

Figure 4:
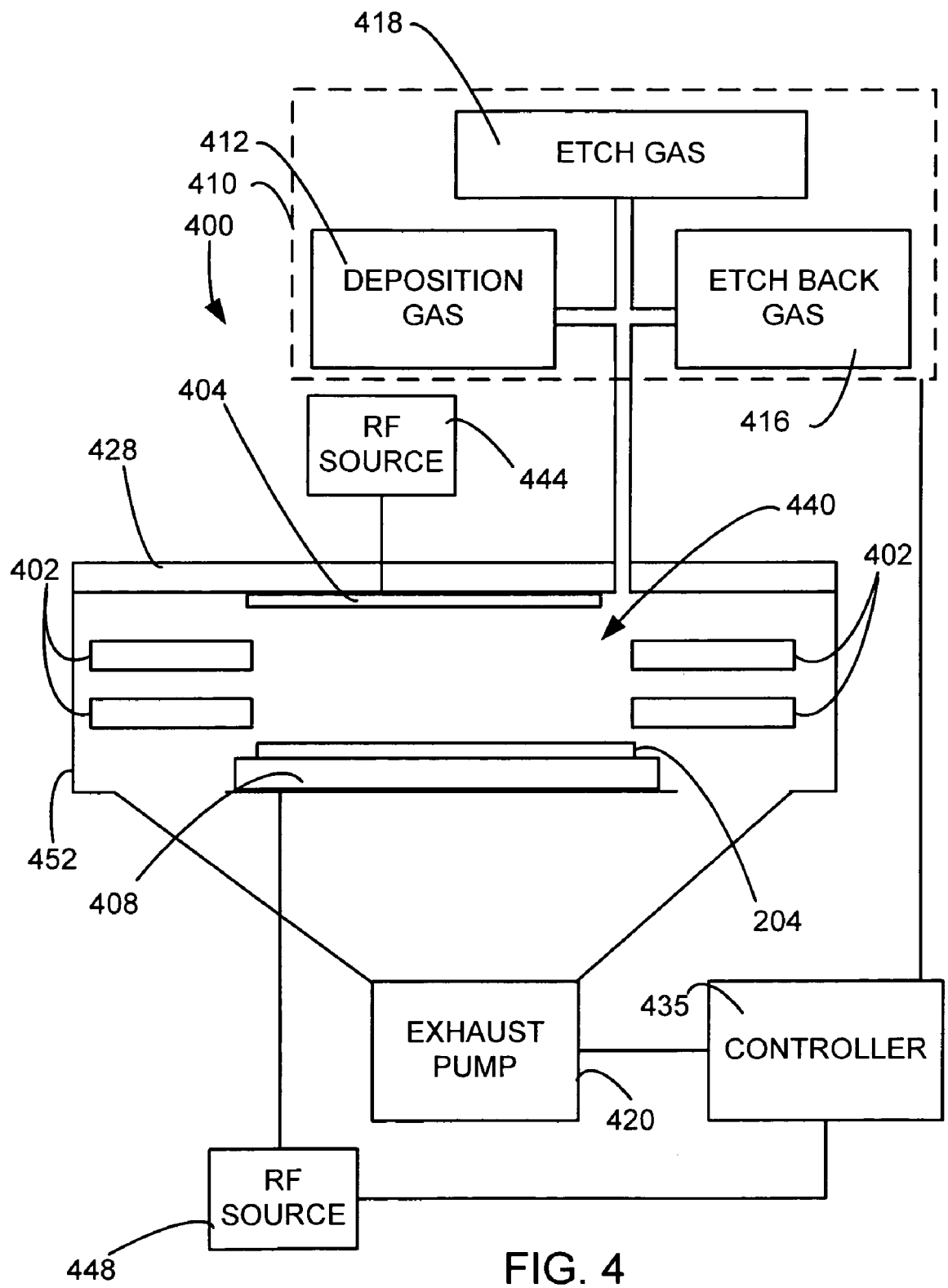
FIG. 4 is a schematic view of a plasma processing chamber that may be used in practicing the invention.

FIG. 4 is a schematic view of an processing chamber 400 that may be used for forming the sidewall layer, etching, and stripping. The plasma processing chamber 400 comprises confinement rings 402, an upper electrode 404, a lower electrode 408, a gas source 410, and an exhaust pump 420. The gas source 410 comprises a deposition gas source 412 and an etch back gas source 416. The gas source 410 may comprise additional gas sources, such as an etching gas source 418. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
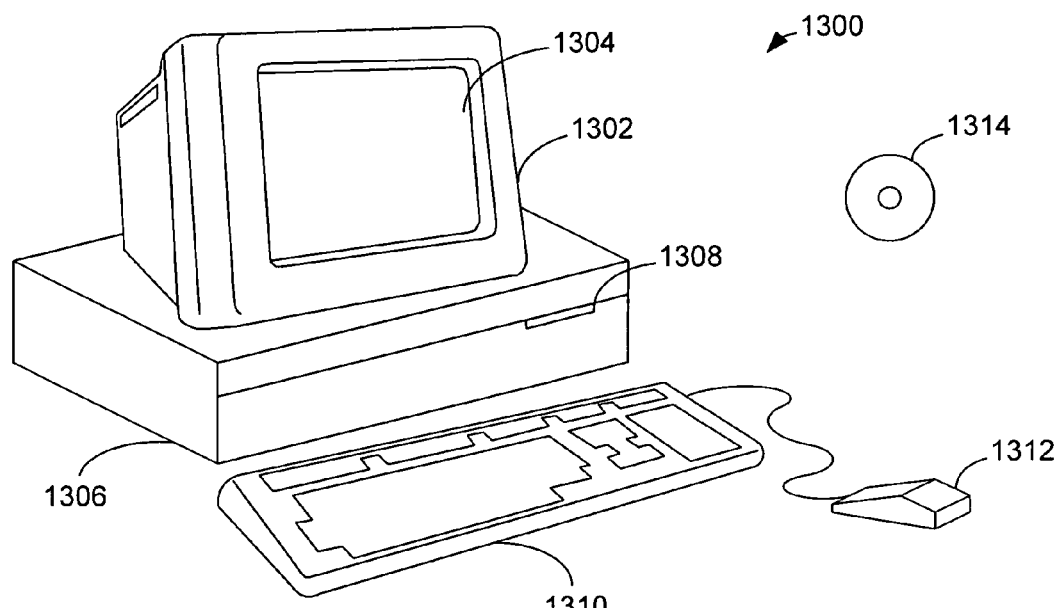
FIGS. 5A-B illustrate a computer system, which is suitable for implementing a controller used in embodiments of the present invention.
Figure 5B:
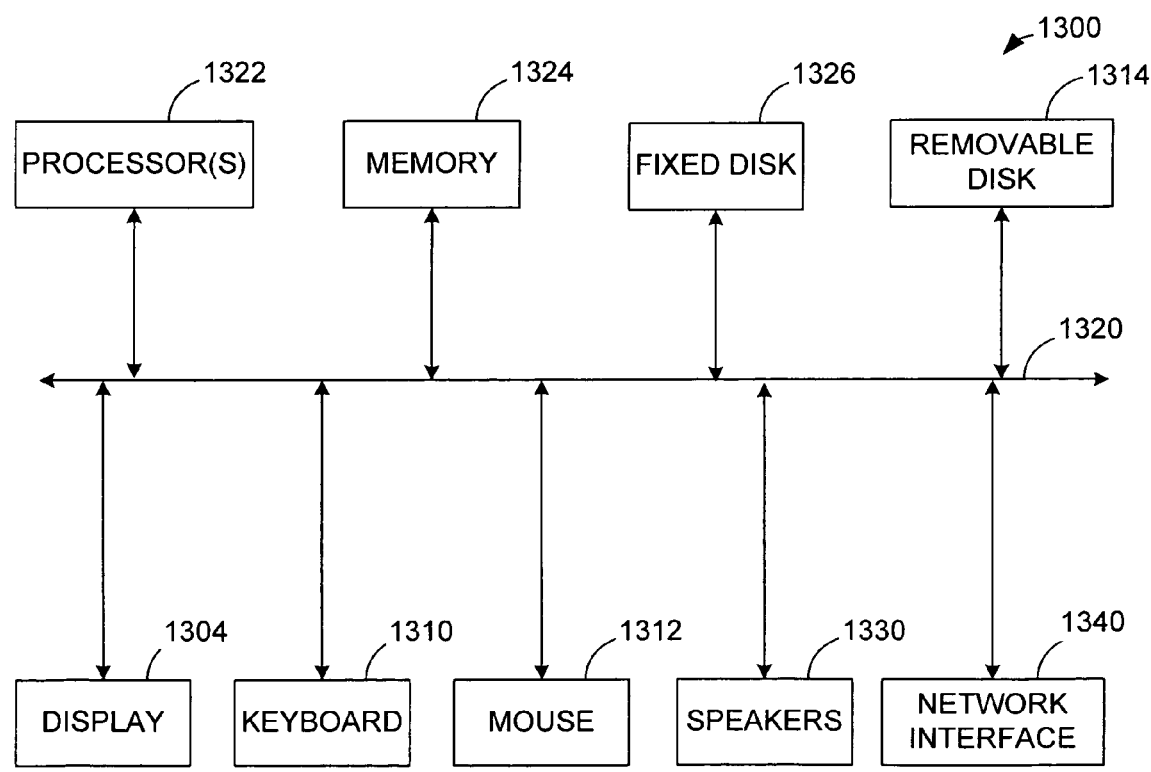

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge-super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In the etch chamber, a sidewall layer is formed over the sidewalls of the photoresist features (step 108). An example recipe for the deposition of the conformal layer (step 304), the deposition gas source 412 provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz.

Figure 6A:
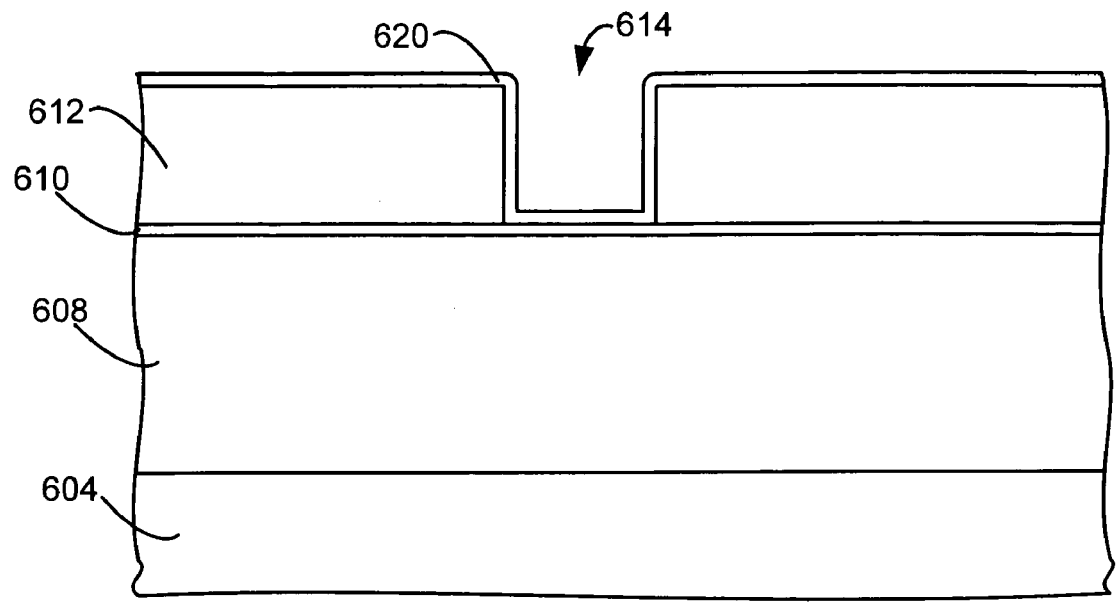
FIGS. 6A-B are schematic cross-sectional views of a stack processed according to an embodiment of the invention.

FIG. 6A is a schematic cross-sectional view of a substrate 604 under an etch layer 608, under an ARC layer 610, under a patterned photoresist layer 612, under a deposited conformal layer 620. In this example, the conformal layer 620 covers the sidewalls and top of the photoresist layer 612 and the ARC 610 at the bottom of the photoresist features 614. In other embodiments, the conformal layer might not be deposited on the ARC at the bottom of the photoresist features. Preferably, the deposited conformal layer is between a monolayer to 20 nm thick. More preferably, the deposited conformal layer is between a monolayer and 7 nm thick. Most preferably, the deposited conformal layer is between a monolayer and 2 nm thick.

Preferably, the depositing the conformal layer comprises at least one of atomic layer deposition, chemical vapor deposition, sputtering deposition, plasma deposition, and plasma enhanced chemical vapor deposition. More preferably, the depositing the conformal layer comprises at least one of chemical vapor deposition. sputtering deposition, plasma deposition, and enhanced chemical vapor deposition. Preferably, the substrate temperature is maintained between −80° C. and 120° C. Generally, 120° C. is the glass transition temperature of photoresist. It is preferred to keep the substrate temperature below that glass transition temperature of the photoresist. More preferably, the substrate temperature is maintained between −10° C. and 50° C. Most preferably, the substrate temperature is maintained at 20° C. Preferably, the bias potential is less than 120 volts. More preferably, the bias potential is less that 100 volts. Most preferably, the bias potential is between 20 and 80 volts.

Preferably, the deposited layer comprises at least one of polymer, TEOS, $SiO_2$, $Si_3N_2$, SiC, Si, $Al_2O_3$, AlN, Cu, $HfO_2$, Mo, Ta, TaN, $TaO_2$, Ti, TiN, $TiO_2$, TiSiN, and W. A polymer is a hydrocarbon based material, such as a fluorohydrocarbon material.

During the etch back (step 308), a halogen (i.e. fluorine, bromine, chlorine) containing gas, such as 100 sccm $CF_4$, is provided. In this example, $CF_4$ is the only gas provided during the etch back. A pressure of 20 mTorr is provided to the chamber. The second RF source 448 provides 600 Watts at a frequency of 27 MHz and 0 Watts a frequency of 2 MHz.

Figure 6B:
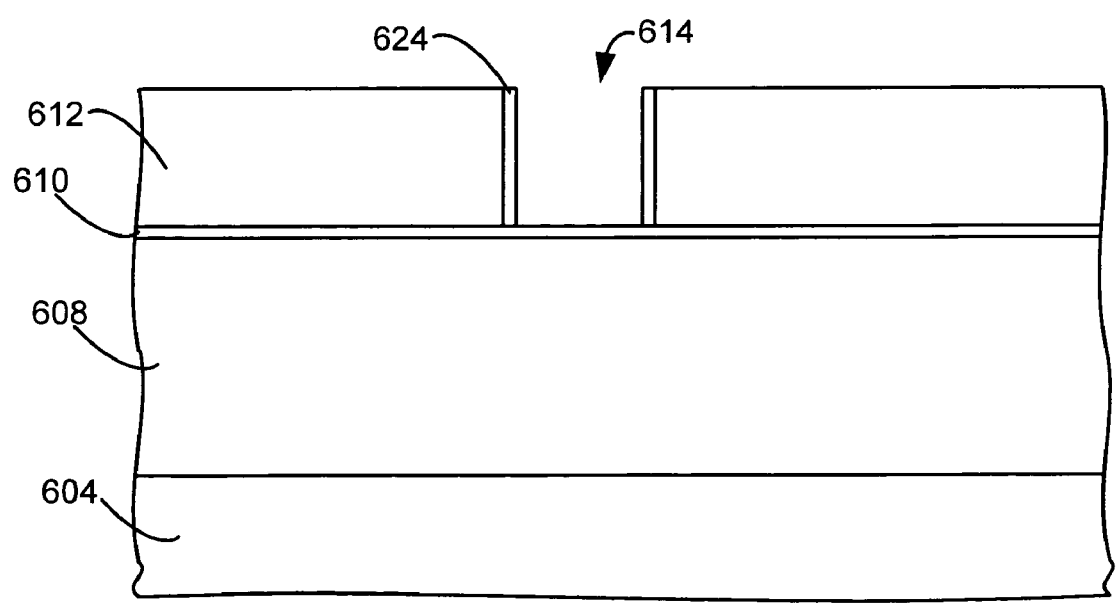

FIG. 6B is a schematic cross-sectional view of a substrate 604 under an etch layer 608, under an ARC layer 610, under a patterned photoresist layer 612 after the conformal layer has been etched back to form sidewalls 624 from the deposited conformal layer. In this example, the parts of the conformal layer covering the top of the photoresist layer 612 and the ARC at the bottom of the photoresist features 614 is removed, leaving only a layer on the sidewalls of the photoresist features. In other embodiments, the part of the conformal layer over the top of the photoresist may remain, so that only the layer at the bottom of the photoresist features over the ARC is removed by the etch back. However, in such an embodiment, some of the conformal layer over the top of the photoresist is removed. In such an embodiment, the conformal layer remaining over the top of the photoresist layer may be used as an etch hard mask.

In this example, the cycle of forming the sidewalls (step 108) comprising the steps of depositing the conforming layer (step 304) and etching back (step 308) is performed using at least 2 cycles. More preferably, the forming the sidewalls is performed between 3 and 50 cycles. Most preferably, the forming the sidewalls is performed between 3 and 10 cycles. Preferable the completed sidewall layers are thin and etch resistant, such as less than 100 nm thick. More preferably, the completed sidewall layers are between a monolayer and 50 nm thick. Most preferably, the complete sidewall layers are between a monolayer and 2 nm thick.

In other embodiments etch cycle may further include additional deposition and/or etch back steps.

An example of a break through etch recipe may be used to remove any remaining deposited layer on the bottom of the photoresist features. Such a break through may use a recipe like the recipe used for the etch back.

An example of a layer to be etched is may be a conventional etch layer, such as SiN, SiC, an oxide or low-k dielectric. A conventional etch recipe may be used to etch the layer to be etched.

To strip the photoresist and the sidewall layer (step 120) an oxygen ashing may be used.

The forming of the sidewall layer over several cycles provides an improved sidewall layer profile. Providing the sidewall layer through the above method has been found to unexpectedly reduce line edge roughness. In addition, the sidewall layer provides improved selectivity control. It is believed forming a sidewall layer without a top layer or bottom layer can reduce line edge roughness.

In a preferred embodiment of the invention, the deposition of the deposited layer, etch back, break through etch, and etching of the layer through the sidewall layer may be done in situ in the same etch chamber, as shown.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming a feature in a layer with reduced line edge roughening, comprising:
    forming a photoresist layer over the layer;
    patterning the photoresist layer to form photoresist features with photoresist sidewalls;
    forming a sidewall layer with a thickness less than 100 nm over the sidewalls of the photoresist features, comprising performing for a plurality of cycles, wherein each cycle comprises depositing a layer on the photoresist layer wherein the deposited layer has a thickness between a monolayer to 20 nm;
    etching features into the layer through the photoresist features; and
    stripping the photoresist layer and sidewall layer.

2. The method, as recited in claim 1, wherein each cycle of the forming the sidewall layer, further comprises etching back the deposited layer to remove parts of the deposited layer formed over bottoms of the photoresist features, while leaving a sidewall layer.

3. The method, as recited in claim 2, wherein the depositing the layer on the photoresist layer, comprises performing at least one of atomic layer deposition, chemical vapor deposition, sputtering deposition, plasma deposition, and plasma enhanced chemical vapor deposition, with a bias potential of less than 120 volts.

4. The method, as recited in claim 3, further comprising heating the substrate to a temperature between −80° C. to 120° C. during the depositing the layer on the photoresist layer.

5. The method, as recited in claim 4, wherein the depositing the sidewall layer over the sidewalls is performed for between 3 and 10 cycles.

6. The method, as recited in claim 5, the depositing the layer on the photoresist layer comprises depositing a layer of at least one of polymer, TEOS, $SiO_2$, $Si_3N_2$, SiC, Si, $Al_2O_3$, AlN, Cu, $HfO_2$, Mo, Ta, TaN, $TaO_2$, Ti, TiN, $TiO_2$, TiSiN, and W.

7. The method, as recited in claim 6 further comprising performing a break through etch to etch through any remaining deposited layer.

8. The method, as recited in claim 7, wherein the depositing the layer on the photoresist layer, the etching back, the break through, and the etching features are done in situ in a single plasma chamber.

9. The method, as recited in claim 2 wherein the etching back further removes parts of the deposited layer over a top of the photoresist layer.

10. The method, as recited in claim 2, wherein the depositing the layer on the photoresist layer, comprises performing at least one of chemical vapor deposition, sputtering deposition, plasma deposition, and plasma enhanced chemical vapor deposition.

11. The method, as recited in claim 10, wherein the depositing the layer on the photoresist layer further comprises providing a bias potential of less than 120 volts.

12. The method, as recited in claim 11, wherein the depositing the layer on the photoresist layer, the etching back, the break through, and the etching features are done in situ in a single plasma chamber.

13. The method, as recited in claim 2, wherein the depositing the layer on the photoresist layer, the etching back, and the etching features are done in situ in a single plasma chamber.

14. A method for forming a feature in an etch layer with reduced line edge roughening, comprising:
    forming a patterned photoresist layer to over the etch layer to form photoresist features with photoresist sidewalls;
    forming a sidewall layer with a thickness less than 100 nm over the sidewalls of the photoresist features, comprising performing for a plurality of cycles, wherein each cycle comprises:
        depositing a layer on the photoresist layer wherein the deposited layer has a thickness between a monolayer to 20 nm; and
        etching back the deposited layer to remove parts of the deposited layer formed over bottoms of the photoresist features, while leaving a sidewall layer;
    etching features into the etch layer through the photoresist features; and
    stripping the photoresist layer and sidewall layer, wherein the depositing the layer on the photoresist layer, the etching back, the etching features, and stripping are done in situ in a single plasma chamber.

15. The method, as recited in claim 14, wherein the depositing the layer on the photoresist layer, comprises performing at least one of atomic layer deposition, chemical vapor deposition, sputtering deposition, plasma deposition, and plasma enhanced chemical vapor deposition, with a bias potential of less than 120 volts.

16. The method, as recited in claim 15, further comprising heating the substrate to a temperature between 80° C. to 120° C. during the depositing the layer on the photoresist layer.

17. The method, as recited in claim 14, wherein the depositing the sidewall layer over the sidewalls is performed for between 3 and 10 cycles.

18. The method, as recited in claim 14, the depositing the layer on the photoresist layer comprises depositing a layer of at least one of polymer, TEOS, $SiO_2$, $Si_3N_2$, SiC, Si, $Al_2O_3$, AlN, Cu, $HfO_2$, Mo, Ta, TaN, $TaO_2$, Ti, TiN, $TiO_2$, TiSiN, and W.

* * * * *